United States Patent [19]
Batra et al.

[11] Patent Number: 5,789,317
[45] Date of Patent: Aug. 4, 1998

[54] LOW TEMPERATURE REFLOW METHOD FOR FILLING HIGH ASPECT RATIO CONTACTS

[75] Inventors: Shubneesh Batra; Gurtej Sandhu, both of Boise, Id.

[73] Assignee: Micron Technology, Inc., Boise, Id.

[21] Appl. No.: 631,445

[22] Filed: Apr. 12, 1996

[51] Int. Cl.⁶ .................................................. H01L 21/44
[52] U.S. Cl. ........................ 438/642; 438/688; 438/680; 438/627
[58] Field of Search .................... 437/194, 192, 437/196, 202, 247; 257/741, 742, 750, 765, 768; 438/642, 627, 653, 660, 675, 680, 688

[56] References Cited

U.S. PATENT DOCUMENTS

| | | |
|---|---|---|
| 4,742,014 | 5/1988 | Hooper et al. |
| 4,758,533 | 7/1988 | Magee et al. ............................ 437/173 |
| 4,970,176 | 11/1990 | Tracy et al. ............................. 437/187 |
| 5,019,533 | 5/1991 | Cuddihy et al. |
| 5,169,803 | 12/1992 | Miyakawa ............................... 437/197 |
| 5,266,521 | 11/1993 | Lee et al. ................................ 437/188 |
| 5,312,774 | 5/1994 | Nakamura et al. ...................... 437/192 |
| 5,350,712 | 9/1994 | Shibata ................................... 437/195 |
| 5,358,616 | 10/1994 | Ward |
| 5,360,524 | 11/1994 | Hendel et al. |
| 5,534,463 | 7/1996 | Lee et al. ................................ 437/195 |
| 5,567,243 | 10/1996 | Foster et al. ............................ 118/730 |
| 5,571,749 | 11/1996 | Matsuda et al. ........................ 437/113 |

OTHER PUBLICATIONS

Hirose et al., "Surface Melting Model for Al Reflow into Submicron Contact-holes and Vias," *IEDM*, 557-560, 1994.
Kikuta et al., "Aluminum-Germanium-Copper Multilevel Damascene Process Using Low Temperature Reflow Sputtering and Chemical Mechanical Polishing," *IEDM*, 101-104, 1994.
Park et al., "A Novel Al-Reflow Process Using Surface Modification by the ECR Plasma Treatment and Its Application to the 256Mbit DRAM," *IDEM*, 109-112, 1994.

Primary Examiner—Garidad Everhart
Attorney, Agent, or Firm—Fletcher, Yoder & Edwards

[57] ABSTRACT

Impurities are added to a conductor layer in a semiconductor process to prevent formation of void spaces and encourage complete filling of contacts. The impurities reduce the melting point and surface tension of a conductor layer, thereby improving filling characteristics during a reflow step. The impurities may be added at any time during the process, including during conductor deposition and/or reflow.

28 Claims, 3 Drawing Sheets

# 5,789,317

LOW TEMPERATURE REFLOW METHOD FOR FILLING HIGH ASPECT RATIO CONTACTS

BACKGROUND OF THE INVENTION

1. Field of the Invention

This invention relates generally to semiconductor devices, and more specifically to conductor deposition processes for semiconductors. In particular, this invention relates to reflow processes used to fill high-aspect ratio contacts (or vias).

2. Description of the Related Art

Due to increases in semiconductor packing densities, contact diameters have been reduced, thereby increasing height-to-width or aspect ratios. With increasing aspect ratios, adequate metal step coverage of contact surfaces has become more difficult to achieve, especially at temperatures lower than about 200° C. As the aspect ratio increases, metal deposited at colder temperatures fails to produce good step coverage due to "necking" (or "cusping") at the top corners of contacts. Necking is detrimental because it gives rise to voids at the bottom of the contact, leading to reliability and yield problems. In an attempt to address this problem, various techniques have been developed and employed, including chemical vapor deposition of metals (CVD), laser reflow and aluminum reflow methods.

Of the methods used to fill contacts, the aluminum reflow method offers the advantages of lower cost and fewer process steps. However, most aluminum reflow processes proposed for filling high-aspect ratio contacts have not gained widespread acceptance due to the need for elevated reflow temperatures which are less desirable, particularly for second and higher metal levels. In these aluminum reflow processes, the temperature at which the metal layer is deposited is typically in the range of about 400° C. to about 500° C. These higher deposition temperatures may cause voiding and discontinuities in the metal layer due to the localized absence of sufficient metal to support continuous grain growth. As the aspect ratio increases, this problem may worsen because the amount of metal deposited onto the contact bottom and sidewalls decreases due to necking. High reflow temperatures may further increase the potential for voids by causing the early formation of widely spaced grains that lead to the formation of voids.

In an attempt to modify the aluminum reflow method for high aspect ratio use with lower reflow temperatures, aluminum alloy materials have been employed to reduce the melting point of the metal layer. For example, an Al-Ge-Cu damascene process using low temperature reflow sputtering has been used. In this process, Al-Ge-Cu alloy is deposited at room temperature onto the surface of contacts coated with Ti. The Al-Ge-Cu is then annealed at a reflow temperature of about 400° C. The deposition and annealing steps are repeated as necessary to create a multi-level metallized interconnection. Although this method may be successfully used to create multi-level interconnections at lower reflow temperatures, it suffers from several problems. These problems may include difficulty in etching Al-Ge-Cu due to precipitation of Ge, and degradation in resistivity performance.

Although aluminum reflow processes are preferred due to low cost and simplicity, other techniques have been developed for filling high aspect ratio contacts. For example, flared or tiered contacts have been used to reduce the potential for necking at the contact corners. However, altering the geometry of contact corners results in the loss of semiconductor area. Low metal deposition rates have also been used to ensure adequate coverage, however, low deposition rates increase cost by limiting throughput.

Another method developed for filling high aspect ratio contacts utilizes a multi-step deposition process. In this process, a thin layer of metal is deposited at a cold temperature followed by the deposition of a thick layer of metal at a temperature of about 400° C. to 500° C. However, this process does not entirely eliminate the production of void spaces.

In a laser reflow process, a metal layer is deposited and then planarized by reflowing the metal with a laser. However, this process does not work well with aluminum or aluminum based alloys. When used to reflow aluminum, a native oxide forms on the aluminum and prevents planarization. Aluminum also requires a high optical pulse energy and variations in its surface topography can increase absorbed power and result in damage.

In another method, a metal layer is deposited in two steps using a partially ionized beam (PIB). In this method, a contact is first filled by a metal layer deposited at a temperature of about 150° C. After the contact is filled, a second metal layer is deposited at a temperature of about 300° C. This process produces adequate results, however, it is not practical for use in manufacturing applications due to a low deposition rate and a high substrate bias. The low deposition rate reduces throughput and increases the risk of gaseous inclusion into the metal layer. The high substrate bias is hard to maintain at a constant level and may damage semiconductor devices.

In yet another multi-step metallization process, a thick metal layer is deposited on a semiconductor wafer at a cold temperature of about 200° C. or less. In a second step, the temperature is increased to approximately 400° C. to 500° C. while additional metal is being deposited. Although this method reduces the tendency for void formation, voids may still be formed if insufficient metal is deposited prior to increasing the temperature.

Still other techniques to improve the filling characteristics of aluminum have been tried. These methods include altering the surface characteristics of a contact by coating the contact with a material such as titanium or TiN to improve the wettability and coating conformance of aluminum. However, these methods suffer from reactions between aluminum and titanium that interfere with the reflow process, or require special treatment of a TiN layer, e.g. such as with a plasma treatment.

Consequently, a need exists for a practical and efficient method for filling high aspect ratio contacts. In particular, a need exists for a low cost reflow process that may be used to fill high aspect contacts in a void-free manner.

SUMMARY OF THE INVENTION

The present invention in a broad aspect concerns a conductor deposition process for semiconductor devices in which reflow of the conductor is improved by reducing the melting point and surface tension of the conductor. The invention also relates to a reflow process for efficiently filling high aspect ratio contacts at lower temperatures.

This invention, in one respect is a method of processing a semiconductor substrate having a surface with a contact formed therein, including the steps of depositing a conductor layer on the semiconductor substrate surface, forming an impurity layer in the conductor layer having a reduced melting point temperature and surface tension, and heating the conductor layer to a reflow temperature sufficient to cause the layers to reflow.

In another respect, this invention is a process for semiconductor metallization, including the steps of depositing a metal layer on a semiconductor wafer surface, exposing the exterior surface of the metal layer to a sufficient amount of an impurity to form an impurity layer having a reduced melting point temperature and surface tension, and heating the metal layer to a reflow temperature sufficient to cause the layers to reflow.

In a further respect, this invention is a semiconductor device including a semiconductor substrate having a first layer with a contact formed therein, a conductor layer formed to extend into the contact, and an impurity layer in the conductor layer having a reduced melting point temperature and surface tension.

Using the method of the present invention, the reflow of a conductor is improved by reducing the melting point and surface tension of the conductor by the addition of impurities. The resulting reduction in the melting point of the conductor makes it possible to efficiently fill high aspect ratio contacts at lower temperatures. By "efficient filling" it is meant that good coverage is achieved during the reflow process with the creation of substantially no void spaces within the contact. In those embodiments of this invention where impurities modify the surface and not the bulk of the film, the etchability and electromigration performance of the conductor are generally not substantially degraded.

The present invention offers advantages over methods previously employed to fill high aspect contacts, including for example, low cost and simple processing, efficient filling of contacts at lower temperatures, improved reliability, higher yield and little or no degradation in the resistance of underlying conductor layers.

DETAILED DESCRIPTION OF THE PREFERRED EMBODIMENTS

As used herein, "contact" refers to a hole formed in a layer which is on a semiconductor wafer. The term "contact" may be used interchangeably with the terms "contact hole" and "via". The term "substrate" refers to any semiconductor substrate, such as, for example, a semiconductor wafer substrate. It will be understood by those skilled in the art that the term "substrate" may include either a semiconductor wafer or the wafer along with various process layers formed on the wafer. The term "impurity" may be used interchangeably with the term "impurities" and refers to any material or combination of materials capable of lowering surface tension and/or melting point of a conductor layer. The term "metals" is defined to include metals, refractory metals, intermetallics, or combinations thereof.

Conductor reflow filling occurs due to surface tension driven mass-transport in a surface layer whose thickness depends upon the reflow temperature. In the present invention, the addition of an impurity reduces the melting point of a conductor, thereby lowering the surface tension for flow into a contact. The mass transport of conductor material into a contact occurs due to surface stress vectors which are generally proportional to the product of the surface tension and surface curvature. Mass transport occurs much faster when the surface tension is lower, resulting in quicker filling of a contact, thereby preventing necking and void formation. In a preferred embodiment the conductor may be a metal layer.

Figure 1A:
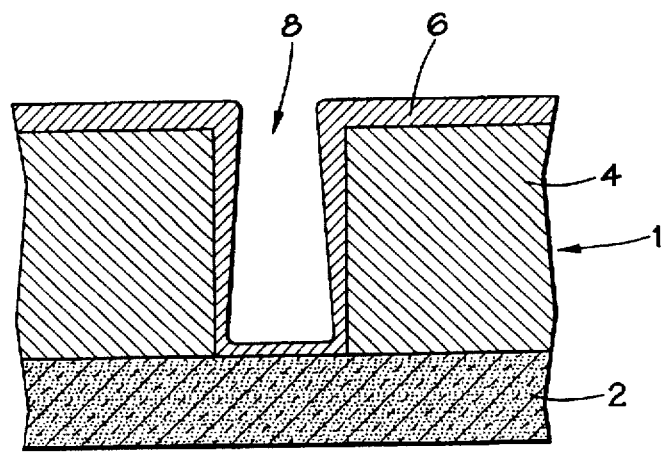
FIGS. 1(a–c) are a sequential, cross sectional representation of the creation of a void space in a contact during filling using prior art methods.
Figure 1B:
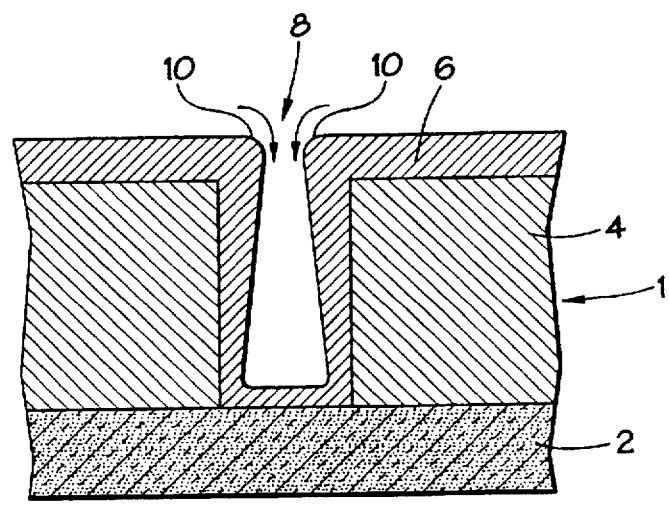

FIGS. 1(a–c) sequentially illustrate the filling of a high aspect ratio contact using a hot sputtering process of the prior art which results in the formation of a void space in the filled contact. In FIG. 1a, a semiconductor wafer 1 having a substrate, conductor or metal layer 2 and a dielectric or insulator layer 4 is represented. It will be recognized by those skilled in the art that metal layer 2 may alternatively be some other conductor layer such as, for example, polysilicon, or may in fact be a semiconductor substrate, such as silicon. Dielectric layer 4 has been etched to form a contact 8 for filling. During the process, conductor layer 6 is deposited on the semiconductor surface in such a way that it coats the sidewall and bottom of contact 8. In FIG. 1b, heat is applied to semiconductor wafer 1 at the same time conductor layer 6 is being deposited. As heat is applied, conductor layer 6 begins to reflow and forms a "neck" 10 at the top corners of contact 8.

Figure 1C:
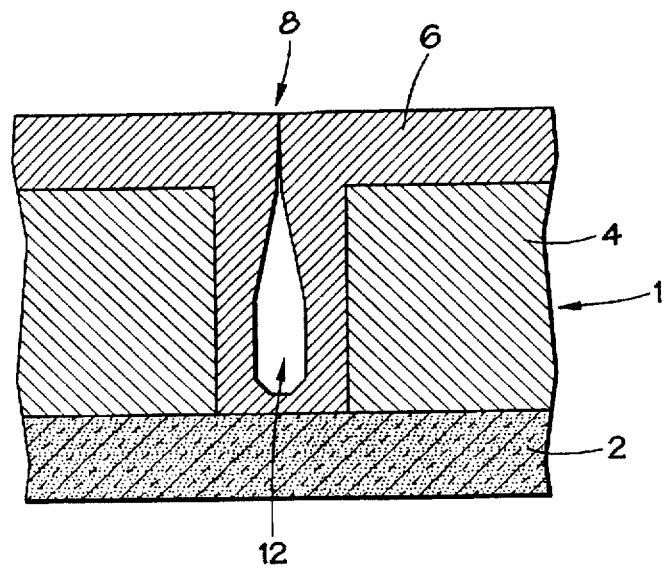

As the reflow process proceeds in FIG. 1c, this neck eventually closes to seal the top of the contact 8, leaving a void space 12 within the contact. The existence of the void space 12 is undesirable because it may render the semiconductor device inoperable or cause reliability problems.

Figure 2A:
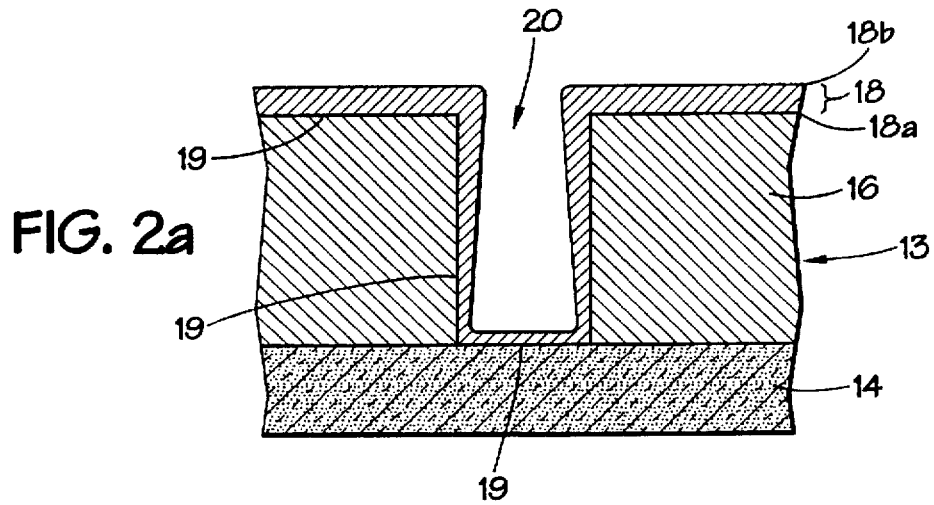
FIGS. 2(a–c) are a sequential, cross sectional representation of an efficient void-free filling of a contact using an embodiment of the present invention having an impurity that migrates to the surface of an upper conductor.

FIGS. 2(a–c) sequentially illustrate the filling of a high aspect ratio contact using a hot sputtering embodiment of the process of the present invention in which conductor deposition and reflow occur at the same time. In FIG. 2a, a semiconductor wafer 13 having a substrate, conductor or metal layer 14, a dielectric or insulator layer 16, and a conductor or metal layer 18 deposited thereon is illustrated. As used herein, layer 14 will be referred to as lower conductor layer 14, and layer 18 will be referred to as upper conductor layer 18. Those skilled in the art will recognize that lower conductor layer 14 may be formed from any number of metals or conductors, such as, for example, silicon, polysilicon, tungsten, titanium, aluminum, etc. Furthermore, upper conductor layer 18 may be formed from any number of metals or conductors, including aluminum, aluminum based metals (such as aluminum alloys), tungsten, titanium, copper, and alloys and combinations thereof, etc. Most preferably, upper conductor layer 18 is aluminum or an aluminum alloy metal.

The exposed portion of the lower conductor layer 14 and the dielectric layer 16 together form the semiconductor wafer surface 19. Prior to deposition of upper conductor layer 18, a contact 20 has been etched into the surface of the semiconductor wafer 19. Once deposition begins, upper conductor layer 18 has an interior surface 18a in contact with the semiconductor wafer surface 19 and an exterior surface 18b not in contact with the surface of the semiconductor wafer. Although FIGS. 2(a–c) illustrate the filling of a contact using a hot sputtering process, in the practice of this invention an upper conductor layer may be deposited on a semiconductor substrate using any suitable conductor deposition technique known to the art, including evaporation, sputtering, hot sputtering, CVD and plasma CVD methods.

Figure 2B:
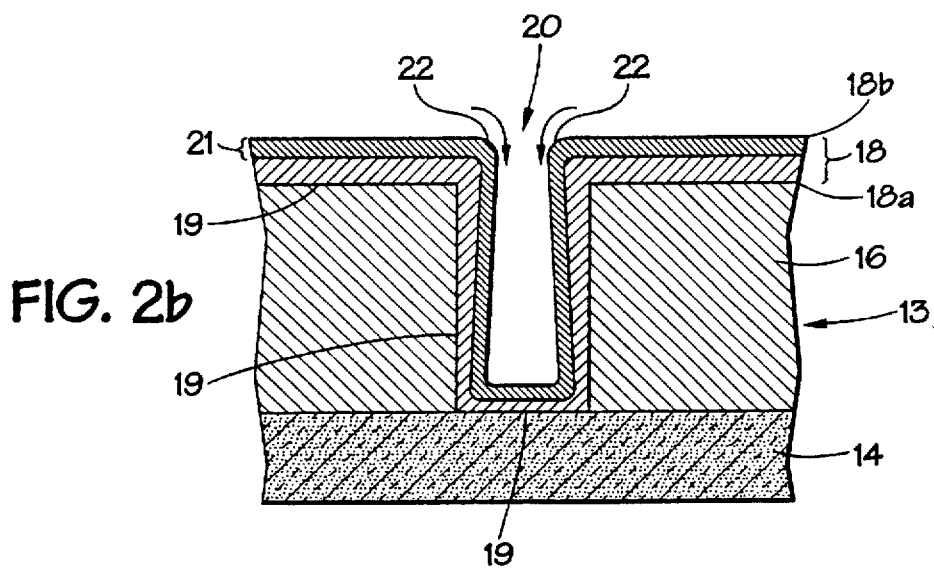

In FIG. 2b, impurities have been added during conductor deposition and reflow to form impurity layer 21. Thus formed, impurity layer 21 is a portion of upper conductor layer 18 that contains a desired concentration of impurities mixed with conductor. Although in FIG. 2b impurities have been added during latter stages of deposition, impurities may alternatively be added at any time during a contact filling process, including prior to deposition, after deposition, continuously and throughout deposition, intermittently during deposition and after deposition during a separate reflow step. In the practice of this invention, impurities may be migrating or non-migrating. Non-migrating impurities tend to remain essentially in place, before and after reflow, with co-deposited conductor material. Migrating impurities may migrate in many ways, including upward, downward, toward exterior or interior surfaces of a conductor layer, or they may disperse throughout a conductor. Migration may be partial or substantially complete, and may occur during reflow and/or during other stages of a process.

In FIG. 2b, impurity layer 21 is formed by exposing upper conductor layer 18 to impurities. Sources of impurities may be gaseous, liquid, solid, or mixed phase in nature, and may be exposed to a conductor at any point in a process using any suitable exposure or deposition method known to the art. For example, when added to a plasma or ambient during hot sputtering or reflow, impurities may be added in a gaseous form to the sputter chamber. Alternatively, a conductor may be deposited on a semiconductor substrate, followed by deposition of a solid impurity on top of the conductor layer. This may be followed by deposition of another conductor layer, a reflow step or a combination thereof. Solid impurities may be deposited using any suitable deposition technique, including evaporation, sputtering, hot sputtering, CVD and plasma CVD. When added between conductor deposition steps, solid impurities may be deposited in the same or different chamber where conductor deposition takes place. Once deposited, a solid impurity may be selected so as to migrate into the surface of a conductor layer to form an impurity layer having a reduced melting point and/or surface tension. In addition to the examples given above, solid impurity sources may also be exposed to a conductor during conductor deposition and/or reflow and gaseous sources may also be exposed to a conductor between or after conductor deposition and/or reflow steps. Combinations of gaseous, liquid and solid impurity exposure steps are also possible.

In FIG. 2b, impurities in layer 21 reduce the conductor melting point, thereby lowering the surface tension of impurity layer 21. Because filling of the contact 20 during reflow occurs due to surface tension-driven mass transport, reduced surface tension causes filling to occur much faster and prevents necking at top corners 22 of contact 20. Because little or no necking occurs, good coverage of contact 20 is achieved and few, if any voids are formed, resulting in a solid metal contact 24 as shown in FIG. 2c.

Figure 2C:
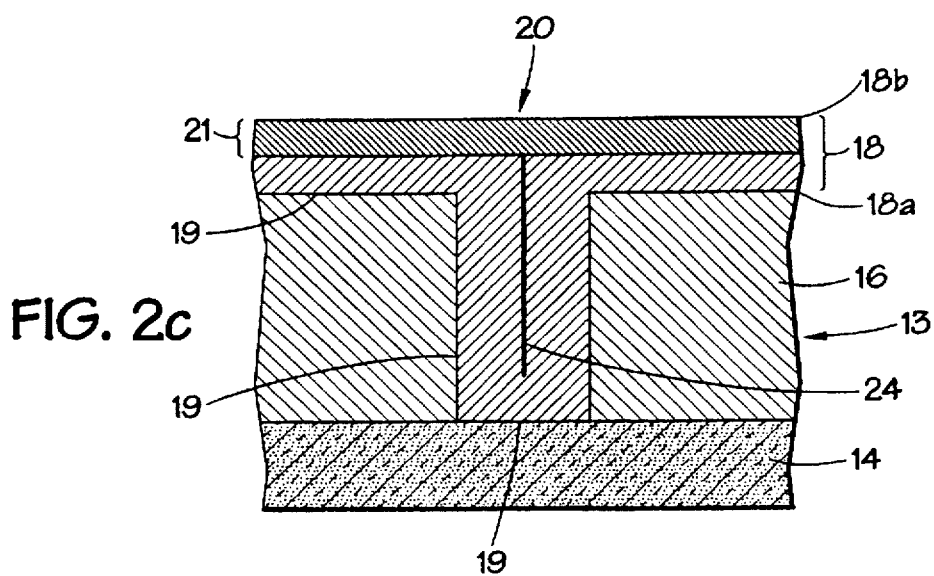

In FIG. 2c, impurity layer 21 is shown at exterior surface 18b of layer 18. In this embodiment of the present invention, impurities deposited during latter stages of conductor deposition and reflow have substantially migrated toward exterior surface 18b to form an impurity layer 21 of generally uniform thickness essentially parallel to exterior surface 18b. This migration leaves the remainder of conductor layer 18, including filled contact 24 substantially free of impurities. Such upward migration may be desirable, for example, when impurities possess or impart unfavorable characteristics to conductor layer 18, such as difficulty in etching or degradation in resistivity performance. Depending on the nature of a conductor layer, this may be the case for impurities that include materials such as germanium or silicon.

Figure 3A:
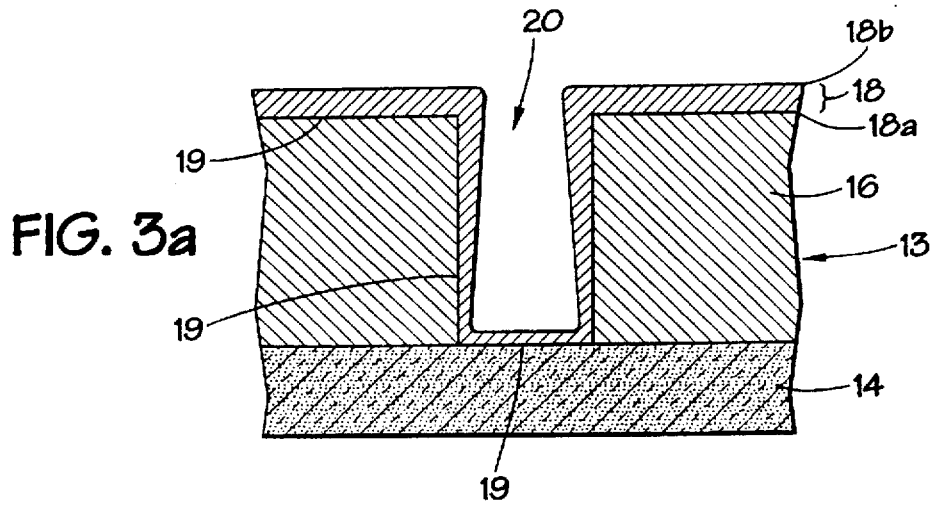
FIGS. 3(a–c) are a sequential, cross sectional representation of an efficient void-free filling of a contact using an embodiment of the present invention having an impurity layer that does not migrate to the surface of an upper conductor.
Figure 3B:
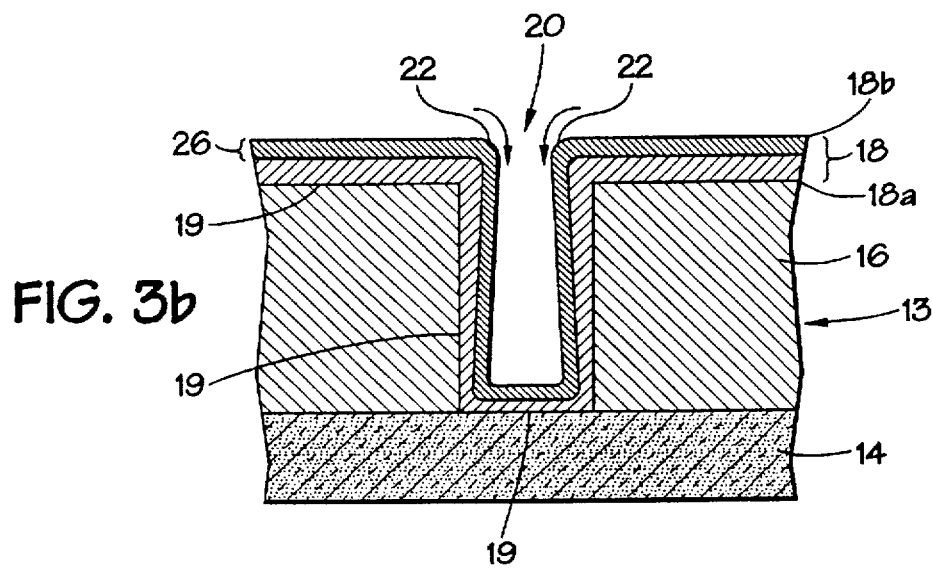
Figure 3C:
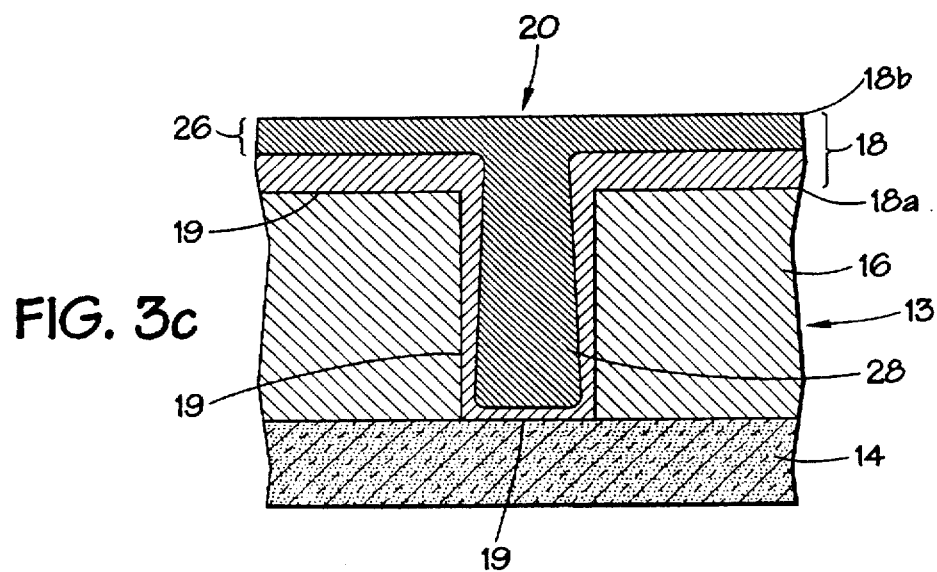

FIGS. 3(a–c) illustrate an embodiment of the present invention in which impurities deposited during conductor deposition and reflow do not migrate through conductor layer 18. In FIGS. 3(a–c), impurity layer 26 has been formed using a hot sputtering deposition and reflow process similar to that used in FIGS. 2(a–c). As before, impurity layer 26 also exists at exterior surface 18b. However, in this embodiment, impurities have not substantially migrated and impurity layer 26 extends downward to form an impurity core or "plug" in contact 28. Such an impurity core may be desirable when impurities possess or impart favorable characteristics to a conductor layer, such as enhanced electromigration performance. Depending on the nature of a conductor layer, this may be the case for impurities containing materials such as copper. Although representative embodiments of the present invention have been illustrated in FIGS. 2(a–c) and 3(a–c), it is not intended that the practice of the present invention be limited to those steps specifically represented in FIGS. 2(a–c) and 3(a–c), nor that perfect void free filling or complete coverage of a contact be required.

Although not illustrated, benefits of the present invention may also be obtained by depositing single or multiple impurity layers within a conductor layer below the surface. An impurity layer may be formed beneath the surface of a conductor layer in many ways. For example, impurities may be "sandwiched" within a conductor layer by a deposition of essentially non-migrating impurities between two depositions of impurity-free conductor material. In this case, impurities may be intermittently deposited as part of one continuous conductor deposition and reflow process, or may be deposited in separate distinct steps between deposition and/or reflow of conductor material and previous impurity layers. This process may be repeated any number of times with non-migrating impurities to form stratified layers of impurities if desired. Migrating impurities may also be deposited in this manner if desired, although stratified impurity layers may not be formed.

In the practice of the present invention, impurities that may be added to reduce the melting point and surface tension of a conductor depend on the type of conductor selected. Impurities may be added to form an impurity layer taking up any desired portion of the overall thickness of a conductor layer, including up to 100% of a conductor layer, but preferably from about 20% to about 80%. So done, the melting point and surface tension of a conductor will be reduced in the region of a conductor layer corresponding to the thickness of such an impurity layer.

Desired reduction in melting point and/or surface tension depend on the type of conductor material present in a conductor layer. Preferably, sufficient impurities are added to reduce the melting point of a conductor in an impurity layer by from about 10% to about 60% of the intrinsic melting point of a conductor. By "intrinsic melting point" it is meant the melting point of a pure element that forms the predominant component of a conductor. Amount of impurities added depends on the conductor selected, the reduction in melting point desired, the thickness of impurity layer desired, and the step in the filling process where impurities are added.

In one preferred embodiment of the present invention, a conductor layer is comprised of aluminum based metal which is deposited on a semiconductor wafer surface using a hot sputtering process. In this embodiment, an aluminum based metal layer is preferably deposited and simultaneously reflowed at as low a temperature as possible. For pure aluminum, reflow temperature is typically greater than about 300° C. and typically less than about 550° C., preferably below about 500° C., and most preferably below about 400° C. In this embodiment, impurities are added by gas flow during about the last 30% of conductor deposition, and deposition and reflow temperature is controlled by amount and type of impurities selected. Acceptable impurities for reducing melting point and surface tension of aluminum based metals, such as pure aluminum, include any suitable gaseous impurity sources known to the art capable of lowering surface tension and melting point of a conductor. Such sources include, but are not limited to, gaseous impurity sources containing silicon, germanium, one or more halogens and mixtures thereof. Some examples of such suitable impurity sources include silane, disilane, germane, $GeF_4$, $SiF_4$, $Cl_2F_2$, $ClF_3$, $ICl_3$, $ICl_5$, $TiCl_4$. In this embodiment, $TiCl_4$ is preferred. Although gaseous impurity sources are used in this embodiment, any suitable solid impurity source known to the art capable of lowering melting point and/or surface tension of aluminum based conductor layers may also be used successfully in the practice of this invention. Such solid sources include but are not limited to metals and metal based materials, such as $WF_6$ and $TaCl_5$.

The reflow process disclosed herein may be utilized in the formation of a wide range of semiconductor devices, including both MOS devices and bipolar devices. For example the reflow process may be used for forming logic devices, microprocessors or memory devices, such as DRAMs, SRAMs or ROMs.

Although some preferred embodiments of the method of the present invention are practiced using a one-step conductor deposition and reflow process, the method of the present invention may also be employed using a multi-step deposition process. When a multi-step deposition process is used, impurities may be added prior to, after, or during any or all of the deposition steps to improve the filling characteristics of a conductor. In addition, conductor reflow may occur simultaneously or separately with any or all conductor deposition and/or impurity deposition steps.

Although the invention has been described by reference to preferred embodiments, it is not intended that the novel methods and compositions be limited thereby, but various modifications are intended to be included as falling within the spirit and broad scope of the foregoing disclosure and the following claims.

What is claimed is:

1. A method of forming a contact, said method comprising the steps of:

(a) providing a substrate having a contact hole formed therein;

(b) depositing conductive material into said contact hole at a temperature that causes said conductive material to reflow, said conductive material having a surface tension and a melting point; and (c) depositing an impurity into said conductive material while said conductive material is being deposited, said impurity causing at least one of said surface tension and said melting point of said conductive material to lower.

2. The method, as set forth in claim 1, wherein said conductive material comprises at least one of aluminum, aluminum alloy, tungsten, tungsten alloy, titanium, titanium alloy, copper, and copper alloy.

3. The method, as set forth in claim 1, wherein said impurity is derived from an impurity source comprising at least one of silane, disilane, germane, $GeF_4$, $SiF_4$, $Cl_2F_2$, $ClF_3$, $ICl_3$, $ICl_5$, $TiCl_4$, $WF_6$, and $TaCl_5$.

4. The method, as set forth in claim 1, wherein step (c) comprises the step of depositing migrating impurities.

5. The method, as set forth in claim 1, wherein step (c) comprises the step of depositing non-migrating impurities.

6. The method, as set forth in claim 1, wherein step (c) comprises the step of lowering said melting point of said conductive material by 10% to 60%.

7. The method, as set forth in claim 1, wherein step (c) comprises the step of depositing said impurity continuously during step (b).

8. The method, as set forth in claim 1, wherein step (c) comprises the step of depositing said impurity intermittently during step (b).

9. The method, as set forth in claim 1, wherein said conductive material comprises aluminum, wherein said impurity is derived from TiCl4, and wherein said impurity is deposited after 70% of said conductive material has been deposited.

10. A method of forming a contact, said method comprising the following steps performed in order:

(a) providing a substrate having a contact hole formed therein;

(b) depositing conductive material into said contact hole, said conductive material having a melting point;

(c) depositing an impurity into said contact hole, said impurity causing said melting point of said conductive material to lower; and (d) reflowing said conductive material and said impurity.

11. The method, as set forth in claim 10, wherein said conductive material comprises at least one of aluminum, aluminum alloy, tungsten, tungsten alloy, titanium, titanium alloy, copper, and copper alloy.

12. The method, as set forth in claim 10, wherein said impurity is derived from an impurity source comprising at least one of silane, disilane, germane, $GeF_4$, $SiF_4$, $Cl_2F_2$, $ClF_3$, $ICl_3$, $ICl_5$, $TiCl_4$, $WF_6$, and $TaCl_5$.

13. The method, as set forth in claim 10, wherein step (c) comprises the step of depositing migrating impurities.

14. The method, as set forth in claim 10, wherein step (c) comprises the step of depositing non-migrating impurities.

15. The method, as set forth in claim 10, wherein step (c) comprises the step of lowering said melting point of said conductive material by 10% to 60%.

16. The method, as set forth in claim 10, wherein step (c) comprises the step of depositing said impurity continuously during step (b).

17. The method, as set forth in claim 10, wherein step (c) comprises the step of depositing said impurity intermittently during step (b).

18. The method, as set forth in claim 10, wherein said conductive material comprises aluminum, wherein said impurity is derived from TiCl4, and wherein said impurity is deposited after 70% of said conductive material has been deposited.

19. The method, as set forth in claim 10, wherein steps (b), (c), and (d) are performed simultaneously.

20. A method of forming a contact, said method comprising the steps of:

(a) providing a substrate having a contact hole formed therein;

(b) depositing conductive material into said contact hole, said conductive material having a melting point; and (c) depositing an impurity onto said conductive material at a temperature that causes said conductive material to reflow, said impurity causing said melting point of said conductive material to lower.

21. The method, as set forth in claim 20, herein said conductive material comprises at least one of aluminum, aluminum alloy, tungsten, tungsten alloy, titanium, titanium alloy, copper, and copper alloy.

22. The method, as set forth in claim 20, wherein said impurity is derived from an impurity source comprising at least one of silane, disilane, germane, $GeF_4$, $SiF_4$, $Cl_2F_2$, $ClF_3$, $ICl_3$, $ICl_5$, $TiCl_4$, $WF_6$, and $TaCl_5$.

23. The method, as set forth in claim 20, wherein step (c) comprises the step of depositing migrating impurities.

24. The method, as set forth in claim 20, wherein step (c) comprises the step of depositing non-migrating impurities.

25. The method, as set forth in claim 20, wherein step (c) comprises the step of lowering said melting point of said conductive material by 10% to 60%.

26. The method, as set forth in claim 20, wherein step (c) comprises the step of depositing said impurity continuously during step (b).

27. The method, as set forth in claim 20, wherein step (c) comprises the step of depositing said impurity intermittently during step (b).

28. The method, as set forth in claim 20, wherein said conductive material comprises aluminum, wherein said impurity is derived from TiCl4, and wherein said impurity is deposited after 70% of said conductive material has been deposited.

* * * * *

UNITED STATES PATENT AND TRADEMARK OFFICE
CERTIFICATE OF CORRECTION

PATENT NO. : 5,789,317
DATED : August 4, 1998
INVENTOR(S) : Shubneesh Batra et al.

Page 1 of 1

It is certified that error appears in the above-identified patent and that said Letters Patent is hereby corrected as shown below:

--GOVERNMENT LICENSE RIGHTS

The U.S. Government has a paid-up license in this invention and the rights in limited circumstances to require the patent owner to license others on reasonable terms as provided for by the terms of Contract No. MDA972-92-C-0054 awarded by the Advanced Research Projects Agency (ARPA). --

Signed and Sealed this

Twelfth Day of June, 2001

*Attest:*

NICHOLAS P. GODICI
*Attesting Officer*    *Acting Director of the United States Patent and Trademark Office*